United States Patent
Monthie et al.

(10) Patent No.: US 7,062,739 B2
(45) Date of Patent: Jun. 13, 2006

(54) GATE REUSE METHODOLOGY FOR DIFFUSED CELL-BASED IP BLOCKS IN PLATFORM-BASED SILICON PRODUCTS

(75) Inventors: James G. Monthie, Fulton, MD (US); Frank A. Walian, Damascus, MD (US); Samit K. Chakraborty, Framingham, MA (US)

(73) Assignee: LSI Logic Corporation, Milpitas, CA (US)

( * ) Notice: Subject to any disclaimer, the term of this patent is extended or adjusted under 35 U.S.C. 154(b) by 291 days.

(21) Appl. No.: 10/696,105

(22) Filed: Oct. 29, 2003

(65) Prior Publication Data

US 2005/0097493 A1 May 5, 2005

(51) Int. Cl.
*G06F 9/455* (2006.01)
*G06F 17/50* (2006.01)

(52) U.S. Cl. .................. 716/8; 716/9; 716/11; 716/16; 716/17

(58) Field of Classification Search .............. 716/8, 716/9, 19, 17, 18, 11
See application file for complete search history.

(56) References Cited

U.S. PATENT DOCUMENTS

| | | | |
|---|---|---|---|
| 5,696,943 A * | 12/1997 | Lee | 716/4 |
| 6,093,214 A | 7/2000 | Dillon | 716/17 |
| 6,453,454 B1 * | 9/2002 | Lee et al. | 716/11 |
| 6,643,840 B1 * | 11/2003 | Kumagai | 716/19 |

OTHER PUBLICATIONS

Tsu-Wei Ku, Using 'Empty Space' for 1C Congestion Relief, EEdesign, Jun. 19, 2003.

* cited by examiner

*Primary Examiner*—Sun James Lin
(74) *Attorney, Agent, or Firm*—Christopher P. Maiorana, P.C.

(57) ABSTRACT

A method for re-using diffused cell-based IP blocks in a structured application specific integrated circuit comprising the steps of (A) implementing one or more blocks of intellectual property (IP) using a plurality of cell-based building blocks and (B) providing one or more alternative views for at least one of the one or more blocks of intellectual property.

20 Claims, 4 Drawing Sheets

GATE REUSE METHODOLOGY FOR DIFFUSED CELL-BASED IP BLOCKS IN PLATFORM-BASED SILICON PRODUCTS

CROSS REFERENCE TO RELATED APPLICATIONS

The present application may relate to co-pending application Ser. No. 10/649,215, filed Aug. 26, 2003, which is hereby incorporated herein by reference in its entirety.

FIELD OF THE INVENTION

The present invention relates to integrated circuit design and fabrication generally and, more particularly, to a gate reuse methodology for diffused cell-based IP blocks in platform-based silicon products.

BACKGROUND OF THE INVENTION

Platform-based silicon products can include a combination of diffused intellectual property blocks (also referred to as IP or macro function blocks) and A-cell based transistor arrays. The IP blocks can include processor cores, high-speed interfaces, and memory. The combination of the IP blocks and the A-cell arrays form a base silicon wafer that can be configured through metal layers for different applications. Often, the diffused IP can be unused in a given application. However, the unused diffused IP blocks can still use routing and placement resources on the die.

It would be desirable to reuse the gates of unused diffused cell-based IP blocks in platform-based silicon products.

SUMMARY OF THE INVENTION

The present invention concerns a method for re-using diffused cell-based IP blocks in a structured application specific integrated circuit comprising the steps of (A) implementing one or more blocks of intellectual property (IP) using a plurality of cell-based building blocks and (B) providing one or more alternative views for at least one of the one or more blocks of intellectual property.

The objects, features and advantages of the present invention include providing a gate reuse methodology for diffused cell-based IP blocks in platform-based silicon products that may (i) create modified netlists for IP blocks, (ii) connect building blocks of IP into a new configuration, (iii) tie off unused building blocks in the netlist, (iv) map the modified netlist onto the placement of the original hard macro, (v) create modified layout views and/or (v) provide multiple views for a given IP block.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
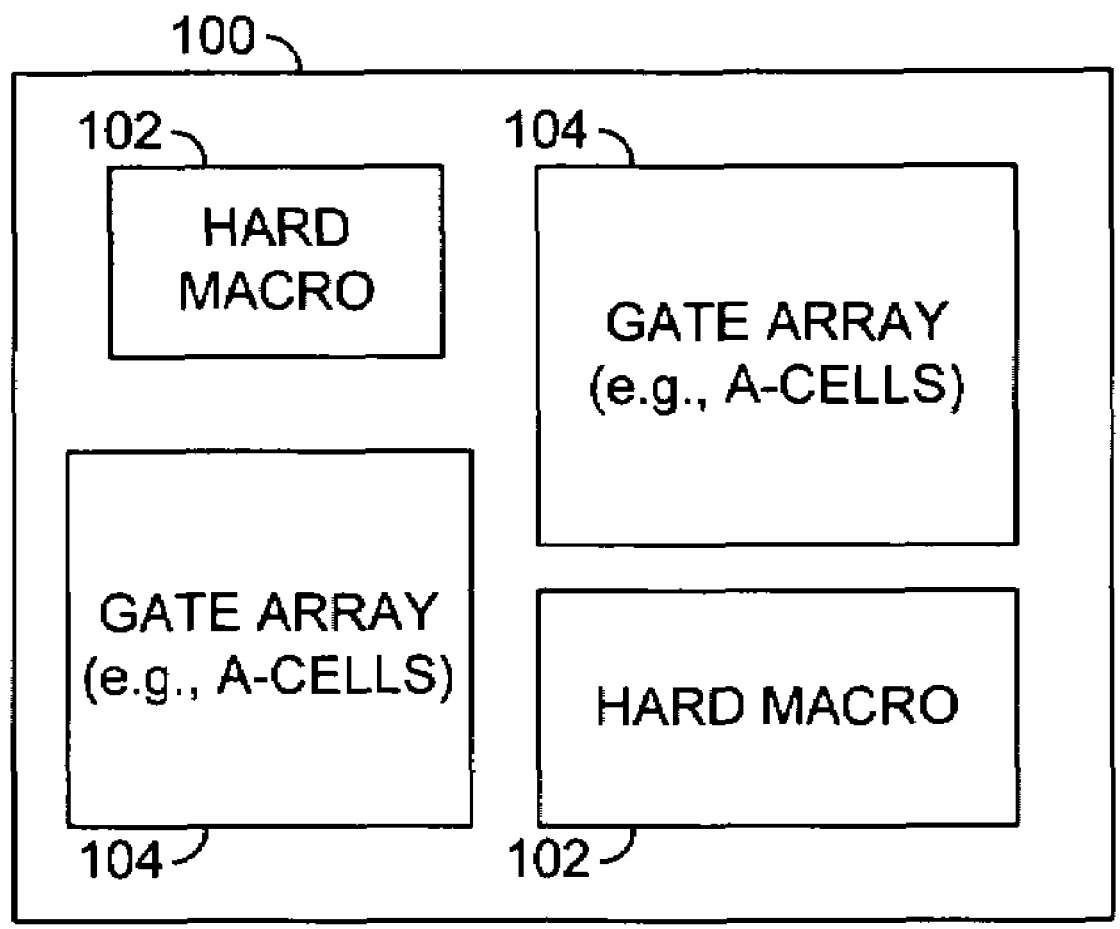
FIG. 1 is a block diagram illustrating an example platform-based silicon product in accordance with the present invention.

Referring to FIG. 1, a block diagram of a die 100 is shown illustrating an example platform-based silicon product in accordance with the present invention. Platform-based silicon products (e.g., a structured application specific integrated circuit (ASIC)) may comprise, in one example, a combination of diffused intellectual property (IP) blocks 102 and one or more A-cell based transistor arrays 104 forming a base silicon wafer that may be configurable through one or more metal layers for different applications. As used herein, A-cells generally refer to an area of silicon designed (or diffused) to contain one or more transistors or gates that have not yet been personalized (or configured) with metal layers. Wire layers may be added to the A-cells to make particular transistors, logic gates and/or storage elements. An A-cell generally comprises one or more diffusions for forming the parts of transistors and/or gates and the contact points where wires may be attached in subsequent manufacturing steps (e.g., to power, ground, inputs and outputs).

In general, the A-cells may be, in one example, building blocks for logic and/or storage elements. For example, one way of designing a chip that performs logic and storage functions may be to lay down numerous A-cells row after row, column after column. A large area of the chip may be devoted to nothing but A-cells. The A-cells may be personalized (or configured) in subsequent production steps (e.g., by depositing metal layers) to provide particular logic functions. The logic functions may be further wired together (e.g., a gate array design).

The diffused IP blocks 102 may comprise, for example, one or more of buffers, buffer stacks (e.g., LIFO and/or FIFO), memory arrays, registers, flip-flops, multiplexers, inverters, counters, signal processor cores, general processor cores, numeric and/or mathematical processor cores, encoders, decoders, transmitters, receivers, high-speed interfaces, communication circuits, analog circuits and/or hybrid circuits. When a particular diffused IP block 102 is unused in a given application, the present invention generally allows reuse of the diffused IP block, routing and placement resources on the die. For example, alternative (e.g., paveover) views may be generated to address routing blockages by opening up the routing layers above the fixed diffused layers in the IP block. Other approaches, which involve making use of the transistors themselves, may require special libraries and tools for implementation.

The gate reuse methodology in accordance with the present invention generally provides a novel approach to gaining back both routing and placement resources within a given unused block of IP. The present invention generally makes use of the cell-based building blocks in a given block of IP to generate a block (or a number of blocks) with different functionalities. For example, a high-speed interface hardmacro, such as a double data rate (DDR) datapath hardmacro, may be built using standard cell gates, such as flip-flops, logic gates and buffers. The placement of the gates is generally fixed once the hardmacro is placed on the base wafer. However, the routing or connectivity of the gates (or cells) making up the hardmacro may be changed through the deposition of different metal layers. In one application the hardmacro may be instantiated as the originally intended DDR block. In another application, the hardmacro may be configured as a single bank of registers. In still another application, the hardmacro may be configured as a combination of buffers and multiplexers. In yet another application, the hardmacro may be configured as a register file.

The present invention generally comprises creating a modified netlist for the unused IP block. The modified netlist generally connects all desired building blocks within the block into the new configuration. Any unused building blocks in the new configuration are generally tied off in the netlist. The modified netlist is generally mapped onto the placement of the original hardmacro and layout views are generated. The placement is generally not changed and the power structures may also be left intact. The new hardmacro may be fully routed based on the new connectivity.

When the modified views are incorporated into a database, each application may call out one of multiple views that may exist for a particular hardmacro. For example, one application may instantiate the hardmacro as the original DDR block. A second application may instantiate the hardmacro as a bank of registers that connects to a different I/O interface. A third application may call out the register file view, etc.

The present invention has an advantage in that multiple views of a pre-defined cell-based hardmacro may be generated at any point in time. In one example, some thought may be given to accommodating more than one application before designing a particular hardmacro. For example, a single hardmacro may have one view to support a DDR memory interface and another view to support a quad data rate (QDR) memory interface. The views may be differentiated through different metalizations. Each application employing the hardmacro may call in an appropriate view. For example, an application that does not use the DDR hardmacro may still use the I/O slots that sit on the one side of the DDR hardmacro. If the interface is speed critical, the registers that connect to the I/O slots should be placed next to the I/O slots. Making use of the registers in the DDR hardmacro would accomplish this goal. In one example, a special view may be generated when required. For example, an alternate view may be generated long after the original hardmacro and base wafer have been designed.

In general, no special tools or libraries are used to implement the gate reuse methodology in accordance with the present invention. New netlists may be, in one example, created manually (e.g., with a text editor) or automatically (e.g., from a register transfer level (RTL) format using ECO compiler tools that target an existing set of diffused cell-based gates). Routing of the new hardmacro may be performed using available routing tools. The application netlist instantiates the appropriate view.

Figure 2:
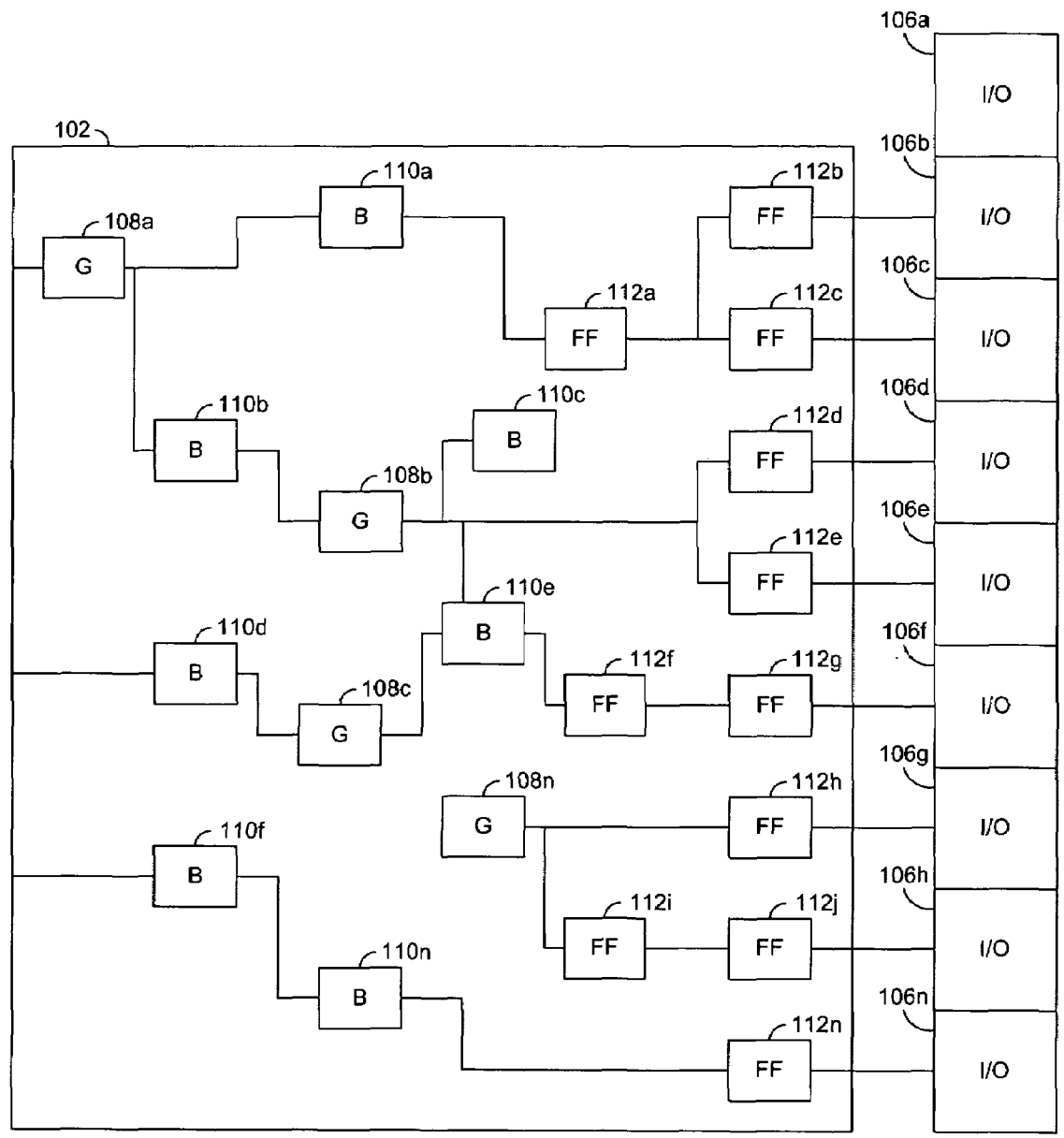
FIG. 2 is a block diagram illustrating a diffused IP hard macro comprising a collection of cell-based structures.

Referring to FIG. 2, a diagram of an IP block 102 is shown illustrating an example configuration of a diffused IP hardmacro. The block 102 may be disposed near a number of I/O blocks 106a–. The block 102 may comprise a collection of cell-based gates 108a–, buffers 110a–and/or flip-flops 112a–. However, other elements may be implemented accordingly to meet the design criteria of a particular application. In one example, a number of signals received by the block 102 may be presented to an input of the gate 108a and inputs of the buffers 110d and 110f. The gate 108a may present a signal to the buffers 110a and 110b. The buffer 110a may present a signal to the flip-flop 112a. The flip-flop 112a may present a signal to the flip-flops 112b and 112c.

The buffer 110b may present a signal to the gate 108b. The gate 108b may present a signal to (i) the buffers 110c and 110e and (ii) the flip-flops 112d and 112e. The buffer 110d may present a signal to the gate 104c. The gate 104c may present a signal to the buffer 110e. The buffer 110e may present a signal to the flip-flop 112f. The flip-flop 112f may present a signal to the flip-flop 112g.

The gate 108n may present a signal to the flip-flops 112h and 112i, the flip-flop 112i may present a signal to the flip-flop 112j. The buffer 110f may present a signal to the buffer 110n, the buffer 110n may present a signal to the flip-flop 112n. Each of the flip-flops 112b–112e, 112g, 112h and 112j–112n may present a signal to a respective one of the I/O blocks 106b–. In general, the connections between the I/O blocks 106a–, the gates 108a–, the buffers 110a–and/or the flip-flops 112a–may be implemented in one or more metal layers placed on a base layer of the block 102.

Figure 3:
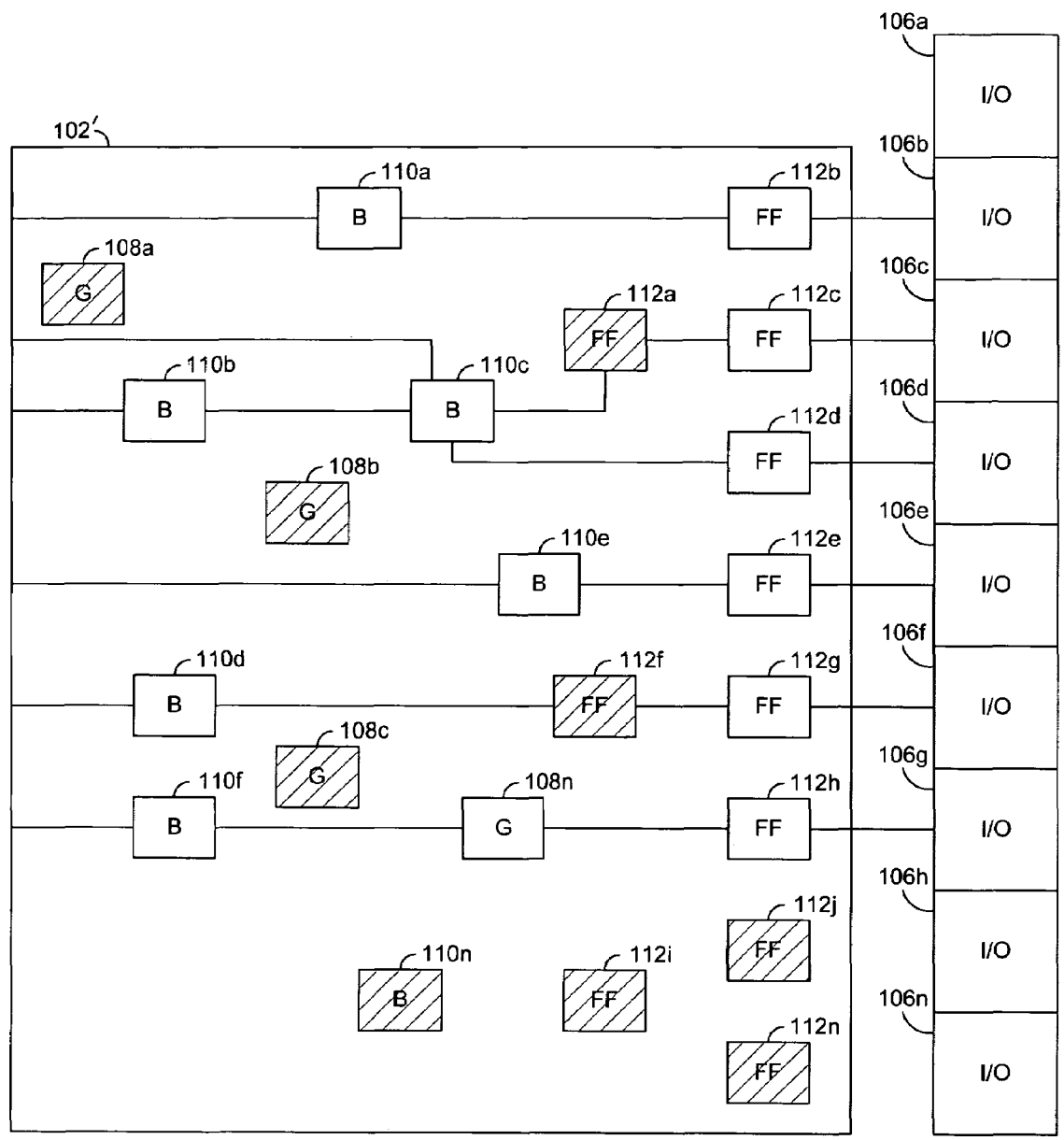
FIG. 3 is a block diagram illustrating an alternative view of the hard macro of FIG. 2 having alternative connections in accordance with the present invention.

Referring to FIG. 3, a diagram of a block 102' is shown illustrating an alternate view of the hardmacro of FIG. 2. The block 102' is generally implemented with the same base layer as the block 102 (e.g., the gates, buffers, flip-flops, etc. have the same general placement). However, an alternate functionality may be realized by placing alternate metal layers over the base layer of the block 102'.

A number of signals received by the block 102' may be presented to an input of each of the buffers 110a–f. The buffer 110a may be configured to present a signal to the flip-flop 112b. The buffer 110b may be configured to present a signal to the buffer 110c. The buffer 110c may be configured to present a first signal to the flip-flop 112a and a second signal to the flip-flop 112d. The flip-flop 112a may be configured to present a signal to the flip-flop 112c. The buffer 110e may be configured to present a signal to the flip-flop 112e. The buffer 110d may be configured to present a signal to the flip-flop 112f. The flip-flop 112f may be configured to present a signal to the flip-flop 112g. The buffer 110f may be configured to present a signal to the gate 108n. The gate 108n may be configured to present a signal to the flip-flop 112h. The flip-flops 112b–112h may be configured to present a signal to a respective one of the I/O blocks 102b–102g. The I/O blocks 102h–102n may be unused.

In addition to the alternate metal layers, any unused cells are generally tied off. For example, the gates 108a–108c, the buffer 110n and the flip-flops 112a, 112f and 112i–may be tied off. As used herein, the phrase tying off and the phrase tied off generally refer to the connection of inputs of unused building blocks to known (predetermined) levels (e.g., VCC, VDD, VSS, etc.). In general, tying off unused building blocks may reduce or eliminate leakage currents and noise.

In general, the unused building blocks may be tied off during the creation of an alternate view for the block of IP. Tying off may be performed by manually editing the netlist or through an ECO compiler tool. For example, a default netlist for a buffer building block may include:

BUFFAFP V1 (.Z(drive_original_net), .A(receive_original_net)).

An alternate view may tie off the buffer by changing the description as follows:

BUFFAFP V1(.Z( ),.A(1'b0)).

In the alternative view, the Z pin is left unconnected (or floating), while the A pin is tied to ground. From a physical standpoint, the buffer V1 would have the same placement. However, the A pin would be routed to the VSS power net with the alternate metal pattern.

Figure 4:
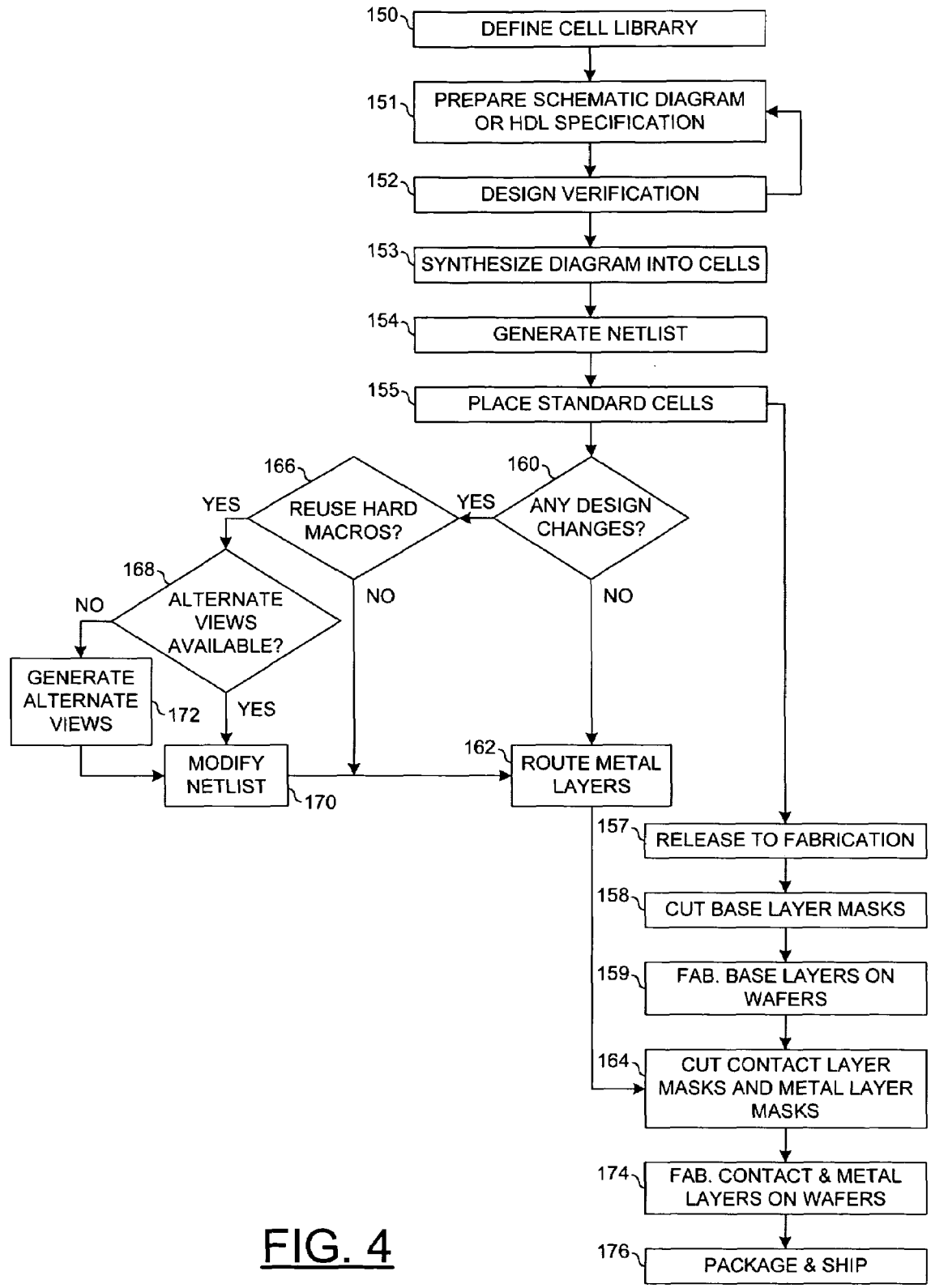
FIG. 4 is a flow diagram illustrating a process for designing and fabricating a cell-based semiconductor integrated circuit in accordance with a preferred embodiment of the present invention.

Referring to FIG. 4, a flow diagram 150 is shown illustrating a process for designing and fabricating a cell-based semiconductor integrated circuit in accordance with a preferred embodiment of the present invention. Standard cell semiconductor integrated circuits may be designed and fabricated by first selecting or defining the standard cell library (e.g., the block 150). The standard cell library is generally defined by the manufacturer of the integrated circuit.

Next, the logic designer generally prepares a schematic diagram or hardware description language (HDL) specification of a logical circuit (e.g., the block 151), in which instances of the standard cells in the cell library are selected and interconnected to form a desired logical function. The schematic diagram or HDL specification may then passed to a computer-aided design verification tool which assists the logic designer in verifying the desired logical function (e.g., the block 152) The design verification may lead to changes in the schematic diagram or HDL specification prepared (e.g., in the block 151).

When the schematic diagram or HDL specification is complete, the schematic diagram may be passed to a series of additional computer-aided design tools, beginning with the block 153, which may assist the logic designer in converting the schematic diagram or HDL specification to a semiconductor integrated circuit layout definition (e.g., a register transfer level (RTL) format) which can be fabricated. For example, in the block 153, the schematic diagram or HDL specification may be synthesized into the standard cells of the cell library defined in the block 150. In the block 154, the design tools may generate a netlist of the selected standard cells and the interconnections between the cells. In the block 155, the standard-cell instances may be placed to form a layout pattern for the integrated circuit by arranging the cells in selected locations. The standard cell instances may be placed manually or by an automatic placement tool.

When the standard cell instances have been placed, the netlist, layout pattern and corresponding cell definitions may be released to fabrication (e.g., the block 157). In fabrication, the base layer masks are generally cut (e.g., the block 158). The base layer masks may include the photolithography masks that are used for fabricating the semiconductor device features on the lowest layers of the wafer, such as the source and drain diffusion regions, the gate oxide areas and the polysilicon gate electrode patterns. Higher level masks such as the photolithography masks that are used for patterning metal routing layers and the electrical contacts between layers may be included in the base layer masks. Once the base layer masks have been developed, the base layers may be fabricated on the wafer (e.g., the block 159).

Concurrently with, or subsequent to, the fabrication process, the logic designer may continue the design process by routing electrical interconnections between the placed standard cell instances along routing paths within the metal routing layers. For example, when no design changes are desired, the process may move to routing the metal layers (e.g., the NO path from the block 160). When the routing layers have been generated (e.g., in the block 162), the routing data may be released to fabrication for use in cutting the metal layer photolithography masks (e.g., the block 164).

However, when there are design changes involving the reuse of one or more of the hardmacros (e.g., the YES paths from the blocks 160 and 166), a database check may be performed to determine whether any alternative views of the hardmacros are available (e.g., the block 168). When an appropriate alternative view is available (e.g., the YES path from the block 168), the netlist may be modified accordingly (e.g., the block 170). However, if an alternative view that supports the desired reuse is not available (e.g., the NO path from the block 168), an appropriate view may be generated (e.g., the block 172). For example, a new view of each hard macro to be reused may be generated manually (e.g., with a text editor) or automatically (e.g., from RTL using ECO compiler tools that target an existing set of diffused cell-based gates). When the new views have been generated, the netlist may be modified (e.g., the block 170), the metal layers routed (e.g., the block 162) and the routing data released to fabrication (e.g., the block 164).

The routing data is generally used to cut the electrical contact layer photolithography masks and the metal routing layer photolithography masks. The electrical contact layer and the metal routing layers may then be fabricated on the wafers (e.g., the block 174. The wafers may then be sliced and diced into individual integrated circuit chips which are packaged and shipped (e.g., the block 176).

While the invention has been particularly shown and described with reference to the preferred embodiments thereof, it will be understood by those skilled in the art that various changes in form and details may be made without departing from the spirit and scope of the invention.

The invention claimed is:

1. A method for re-using diffused cell-based IP blocks in a structured application specific integrated circuit comprising the steps of:
   implementing an original view of one or more blocks of intellectual property (IP) using a plurality of cell-based building blocks, wherein all of said plurality of cell-based building blocks are used by said one or more blocks of intellectual property; and
   providing one or more alternative views for at least one of said one or more blocks of intellectual property, wherein each of said one or more alternative views (i) realizes an alternative functionality for said at least one of said one or more blocks of intellectual property and (ii) re-uses at least one cell-based building block used in said original view by said at least one of said one or more blocks of intellectual property.

2. The method according to claim 1, wherein said cell-based building blocks comprise one or more standard cell gates.

3. The method according to claim 2, wherein placement of said standard cell gates is fixed when said one or more blocks of intellectual property are placed on a base wafer.

4. The method according to claim 1, wherein said cell-based building blocks comprise one or more of a logic gate, a buffer and a flip-flop.

5. The method according to claim 1, further comprising the step of:
   generating said one or more alternative views during design of said one or more blocks of intellectual property.

6. The method according to claim 5, wherein one or more of said one or more alternative views are generated manually.

7. The method according to claim 5, wherein one or more of said one or more alternative views are generated with a text editor.

8. The method according to claim 5, wherein said one or more alternative views are generated automatically.

9. The method according to claim 8, wherein said one or more alternative views are generated from RTL using ECO compiler tools that target an existing set of diffused cell-based gates.

10. The method according to claim 5, wherein one or more of said one or more alternative views are generated prior to instantiation.

11. The method according to claim 5, wherein generating said one or more alternative views comprises the step of:
   modifying a netlist for each of said one or more blocks of intellectual property.

12. The method according to claim 11, wherein any unused building blocks are tied off in said modified netlist.

13. The method according to claim 11, further comprising the step of:
   mapping said modified netlist onto a placement of a corresponding one of said one or more blocks of intellectual property.

14. The method according to claim 13, further comprising the step of:
   generating a layout view of said one or more blocks of intellectual property corresponding to said modified netlist.

15. The method according to claim 14, further comprising the step of:
   routing said one or more blocks of intellectual property based upon said modified netlist.

16. A computer readable medium comprising:
   a default view of one or more blocks of intellectual property (IP) using a plurality of cell-based building blocks, wherein all of said plurality of cell-based building blocks are used by said one or more blocks of intellectual property; and
   one or more alternative views of at least one of said one or more blocks of intellectual property, wherein each of said one or more alternative views (i) realizes an alternative functionality for said at least one of said one or more blocks of intellectual property and (ii) re-uses at least one cell-based building block used in said default view by said at least one of said one or more blocks of intellectual property.

17. The computer readable medium according to claim 16, wherein said one or more alternative views comprise a modified netlist for said at least one of said one or more blocks of intellectual property.

18. An integrated circuit comprising:
   a base layer containing one or more blocks of intellectual property (IP) using a plurality of cell-based building blocks according to an original view, wherein all of said plurality of cell-based building blocks are used by said one or more blocks of intellectual property; and
   one or more metal layers instantiating said one or more blocks of intellectual property, wherein said one or more metal layers comprise routing based upon an alternative view for at least one of said one or more blocks of intellectual property, wherein said alternative view (i) realizes an alternative functionality from said original view for said at least one of said one or more blocks of intellectual property and (ii) re-uses at least one cell based building block used in said original view by said at least one of said one or more blocks of intellectual property.

19. The integrated circuit according to claim 18, wherein said alternative view comprises a modified netlist for said at least one said one or more blocks of intellectual property.

20. The integrated circuit according to claim 19, wherein said modified netlist for said at least one of said one or more blocks of intellectual property comprises one or more standard cell gates that are tied off.

* * * * *